(12) United States Patent
Dixit et al.

(10) Patent No.: US 7,471,110 B2
(45) Date of Patent: Dec. 30, 2008

(54) CURRENT MODE INTERFACE FOR OFF-CHIP HIGH SPEED COMMUNICATION

(75) Inventors: Abhay Dixit, San Diego, CA (US); Mehdi Hamidi Sani, Rancho Santa Fe, CA (US); Vivek Mohan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/389,332

(22) Filed: Mar. 23, 2006

(65) Prior Publication Data

US 2007/0099564 A1 May 3, 2007

Related U.S. Application Data

(60) Provisional application No. 60/664,916, filed on Mar. 23, 2005.

(51) Int. Cl.
*H03K 19/094* (2006.01)
(52) U.S. Cl. .......................... 326/83; 326/87
(58) Field of Classification Search .............. 327/51, 327/53, 66, 132, 490; 326/82, 83, 86, 87
See application file for complete search history.

(56) References Cited

U.S. PATENT DOCUMENTS

| 5,519,728 | A  | * | 5/1996 | Kuo ........................... 375/257 |
| 6,615,027 | B1 |   | 9/2003 | Sahota et al. |
| 7,176,709 | B2 | * | 2/2007 | Uematsu ...................... 326/30 |
| 2003/0107411 | A1 |   | 6/2003 | Martin et al. |

FOREIGN PATENT DOCUMENTS

WO      2004068812 A2    8/2004

* cited by examiner

*Primary Examiner*—James H. Cho
*Assistant Examiner*—Thienvu V Tran
(74) *Attorney, Agent, or Firm*—Nicholas J. Pauley; Thomas R. Rouse

(57) ABSTRACT

A transceiver interface for data transfer between two integrated circuits (ICs or "chips") utilizes a current mode technique rather than conventional voltage mode differential signaling techniques. A current pulse is injected into one of two transmission wires based on a signal value to be transmitted (e.g., logic "0" or "1") by a driver on a transmitting chip. The current pulse is received as a differential current signal at a receive block in a receiving chip. The differential signal is converted to a low swing differential voltage signal by current comparators. The differential voltage signal may be detected by an op-amp receiver which outputs the appropriate signal value.

10 Claims, 4 Drawing Sheets

CURRENT MODE INTERFACE FOR OFF-CHIP HIGH SPEED COMMUNICATION

CROSS-REFERENCE TO RELATED APPLICATIONS

This application claims priority to U.S. Provisional Patent Application Ser. No. 60/664,916 filed Mar. 23, 2005 and entitled "Current Mode Interface for Off-Chip High Speed Communication."

BACKGROUND

Various applications require two or more integrated circuits (ICs) or "chips" to communicate. Conventional techniques for chip-to-chip data transfer include SSTL (Stub Series Terminated Logic), LVDS (Low Voltage Differential Signaling), LVPECL (Low Voltage Positive Emitter Coupled Logic), CML (Current Mode Logic) and other differential techniques. For very high speed and throughput applications, low swing differential signaling schemes like LVDS have advantages over CMOS (Complementary Metal Oxide Semiconductor) rail-to-rail signaling in that they consume less power, produce less electromagnetic interference (EMI), and exhibit good noise immunity due to their differential signal nature.

An LVDS chip-to-chip interface uses the difference in voltage between two transmission wires to signal information. A transmitter on one chip injects a small current into one wire or the other, depending on the logic level to be sent, e.g., logic "1" or logic "0". The current passes through a resistor at the receiving end of about 100 ohms (matched to the characteristic impedance of the transmission wires), then returns in the opposite direction along the other wire. A receiver on the other chip senses the polarity of this voltage to determine the logic level. The small amplitude of the signal and the tight electric-field and magnetic-field coupling between the two wires reduces the amount of radiated electromagnetic noise.

LVDS and the other differential techniques mentioned above are voltage mode techniques, in which the transmitted current is converted to a voltage at the receiver end to differentiate between logic "1" and logic "0". Noise in the chip environment is mostly voltage noise, and consequently these converted voltage signals are susceptible to noise coupling. Also, high frequency effects attenuate voltage levels at the receiver end, presenting a bottom line for the minimum required voltage swing. In addition, the point at which the current-to-voltage conversion is made experiences considerable capacitance contributed by cable load, pin capacitance, bond pads, electrostatic discharge (ESD) diodes, etc. Consequently, high speed signaling slew rate (I/C) may only be maintained by increasing current, which increases power consumption.

DETAILED DESCRIPTION

Figure 1:
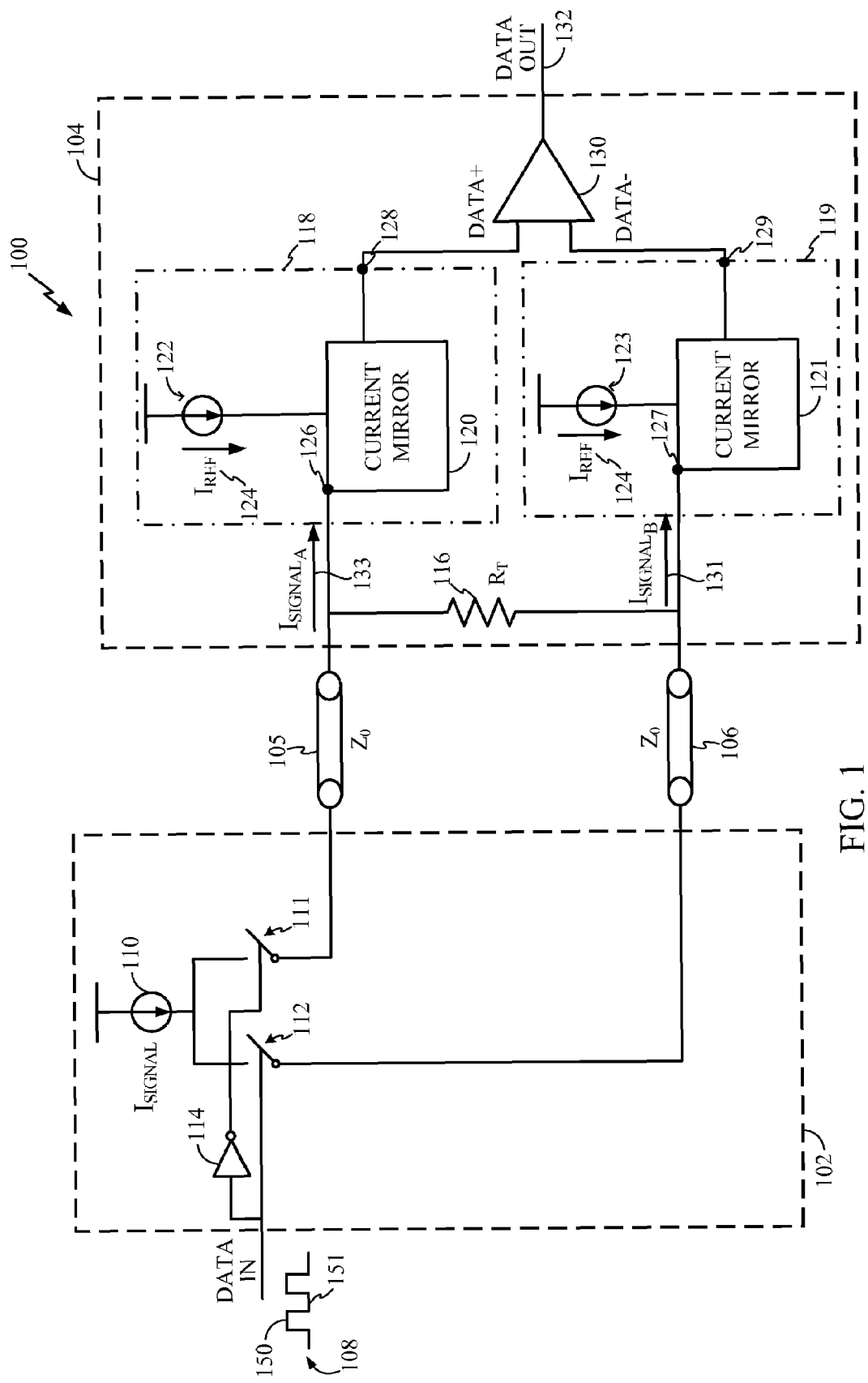
FIG. 1 is a block diagram of a current mode transceiver interface according to an embodiment.

FIG. 1 shows a current mode transceiver interface 100 according to an embodiment. The interface includes a driver 102, included on the transmitting chip, a receive block 104, included on the receiving chip, and dual transmission lines 105, 106. Each chip may include both a driver and a receiver block for bi-directional data transfer between the chips. Also, multiple interfaces may be used to transfer data in parallel between chips.

The driver 102 receives an input data pattern 108 for transmission. Current mode differential signaling over the two transmission lines 105, 106 is used. Based on a voltage level of the input data 108, e.g., a HIGH voltage signal 150 (corresponding to logic "1") or LOW voltage signal (corresponding to logic "0"), a current pulse provided by a current source 110 is sent over one of the transmission lines. Switches 111, 112 control which transmission line, 105 or 106, respectively, the current pulse is sent over. In an embodiment, each switch 111, 112 may be closed in response to a LOW voltage signal and opened for a HIGH voltage signal, with the input to switch 111 being inverted by an inverter 114. Thus, for a HIGH voltage signal 150 (logic "1") in the input data 108, switch 111 is closed and switch 112 is open, allowing the current pulse to travel over transmission line 105, and for a LOW voltage signal 151 (logic "0") in the input data pattern 108, switch 112 is closed and switch 111 is opened, transmitting the current pulse over transmission line 106.

The transmission lines 105, 106 may each have a characteristic impedance of 50 ohms, which is a common impedance value for most low cost transmission media. Both transmission lines are terminated by a resistor 116 at the receiving end. The resistor 116 has a value, e.g., 100 ohms, selected to provide an appropriate receiver end termination. This resistor 116 and current mirror devices 120, 121 determine receiving end impedance.

In the receiving block 104, current comparators 118, 119 may be used to determine which transmission line the current was sent over. Each current comparator 118, 119 may include a current mirror 120, 121 and a reference current $I_{ref}$ source 122, 123, which may be less than 1 mA. In this type of current comparator, when the input current $I_{signal}$ at the input node 126 or 127 is greater than the reference current $I_{ref}$, the voltage at the output nodes 128, 129, respectively, will drop to LOW. Otherwise, the node stays HIGH.

When a current pulse is sent over one of the transmission lines 105 or 106, the two current mirrors 120, 121 will have different currents in them, $I_{signalA}$ 133 and $I_{signalB}$ 131, respectively. These differential currents are mirrored with some gain K (if necessary) and these mirrored currents, $K*I_{signalA}$ and $K*I_{signalB}$, are compared against the reference current $I_{ref}$ 124 supplied through the corresponding current source 122, 123. This will produce a differential voltage, DATA+ and DATA−, at the output nodes 128, 129 of the current comparators 118, 119. A cascode op-amp receiver 130 then senses the differential voltage and produces the rail-to-rail single-ended output voltage, DATA OUT 132.

Figure 2:
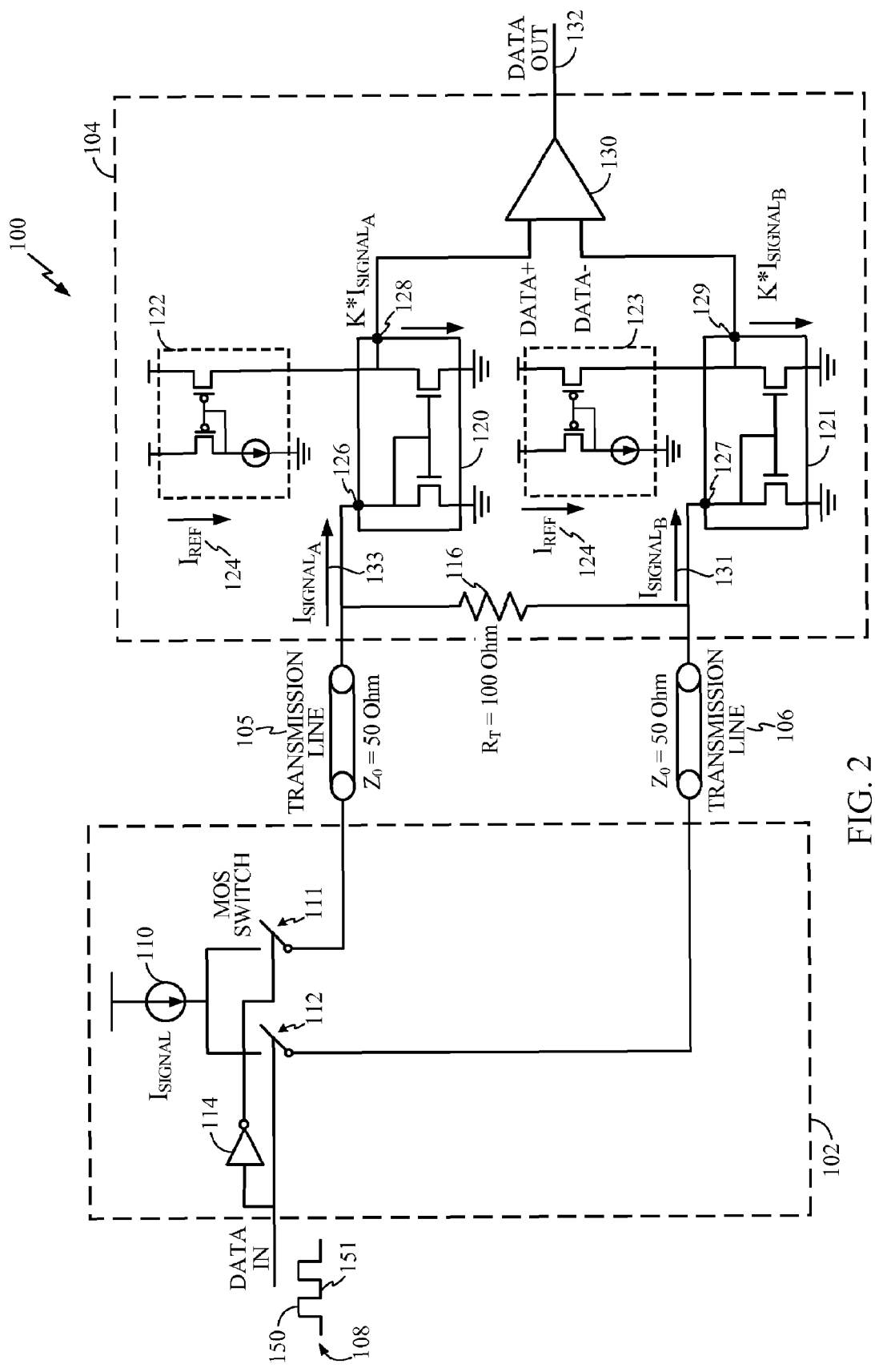
FIG. 2 is a schematic diagram of one implementation of the current mode transceiver interface of FIG. 1.

FIG. 2 is a schematic diagram of an exemplary embodiment of interface 100 in which switches 111, 112 are PMOS transistors, current mirrors 120, 121 are diode configured NMOS current mirrors, and reference current sources 110, 122, 123 are obtained from bias generator circuit. An exemplary data transmission will be described to illustrate operation of the interface 100 shown in FIG. 2. When input data 108 at the driver transitions HIGH 150, the HIGH voltage signal will cause switch 112 to open, and being inverted to a LOW voltage signal by inverter 114, cause MOS switch 111 to close. A current pulse from current source 110 will be transmitted over transmission line 105. A majority of the transmitted current will be input to current mirror 120 as $I_{signalA}$ 133. A small amount of current will cross resistor 116 and enter the other current mirror 121 as $I_{signalB}$ 131. However, open switch 112 at the driver will prevent any of the current crossing resistor 116 from traveling across the other transmission line 106. This differs from other differential techniques such as LYDS, which include a return current path, i.e., current is returned across the non-transmitting line.

Reference current $I_{ref}$ 124 from reference current sources 122 and 123 is selected to be below $K*I_{signal}$ of the transmitting line (in this case transmission line 105) and above $K*I_{signal}$ of the non-transmitting line (in this case transmission line 106). In current comparator 118, $K*I_{signal} > I_{ref}$, causing node 128 (DATA+) to drop LOW. In current comparator 119, $K*I_{signal} < I_{ref}$, causing node 129 (DATA−) to transition HIGH. The cascode op-amp receiver 130 senses the difference between the two voltages and outputs a LOW voltage signal, mirroring the LOW value at input data 108.

Figure 3:
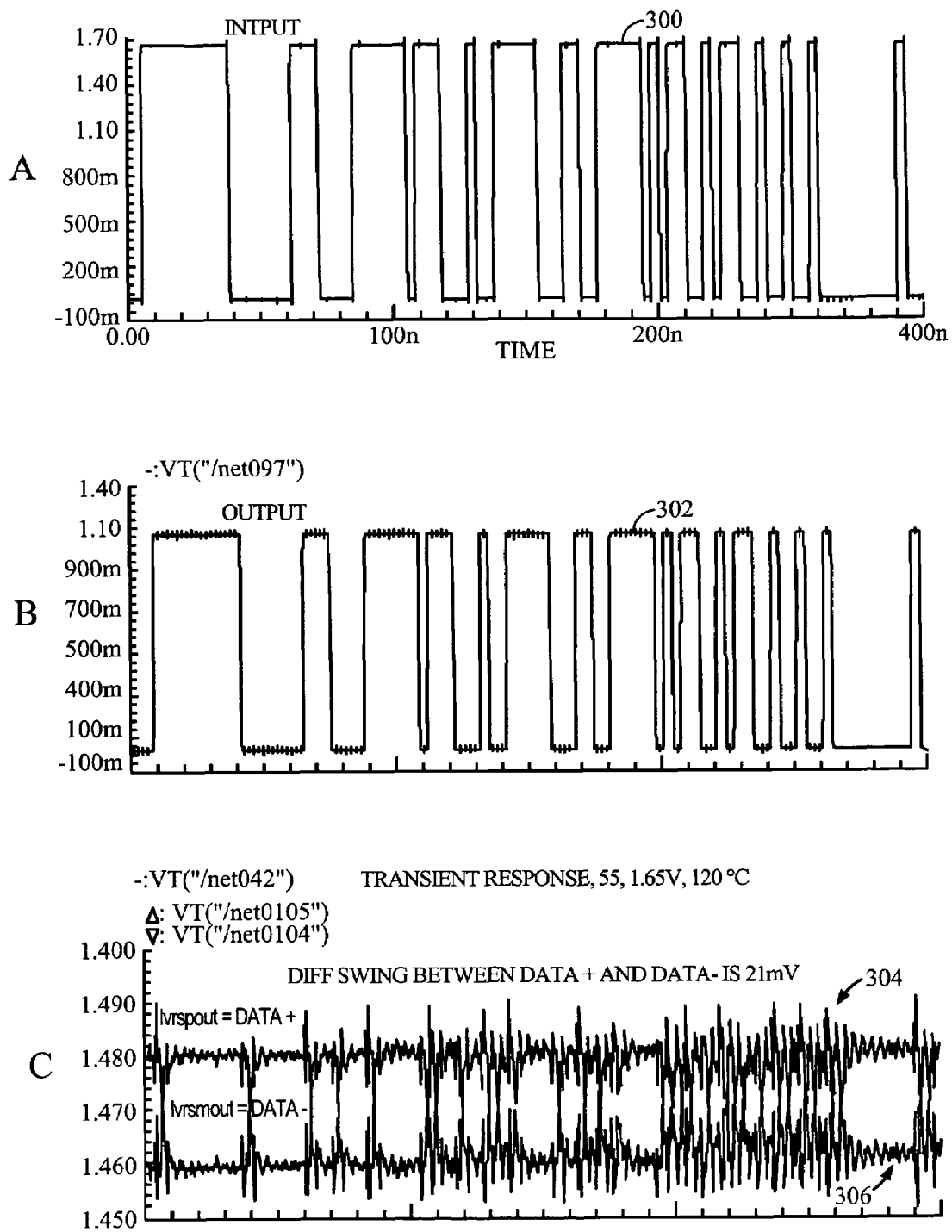
FIGS. 3A-C are plots showing results of simulations performed using the current mode transceiver interface of FIG. 2.

FIGS. 3A-C are plots showing the results of a simulation of the operation of a current mode transceiver interface according to an embodiment. FIG. 3A shows the input data pattern 300 at the driver, which is reproduced accurately by the output data 302 at the receive block, as shown in FIG. 3B. FIG. 3C shows the corresponding voltages 304, 306 at the output nodes (DATA+ 128, DATA− 129) of the current comparators in the receive block. In this simulation, the differential swing between DATA+ 128, DATA− 129 is 21 mV. However, this swing could be made higher by choosing higher value for $I_{ref}$. The differential swing at nodes 126 and 127 could be made as low as 10 to 15 mV, which is significantly lower than typical voltage mode techniques (e.g., ~200 mV). Also, the far end termination impedance could be loosely defined and the source termination at the driver could be used for proper termination of the transmission line.

Since the interface 100 uses true current mode signaling, it has very high noise immunity (typically most of the noise in chips is voltage mode). Also, the point at which current-to-voltage conversion is made in the receive block 104, i.e., nodes 128 and 129, has very low capacitance (mainly gate capacitance), which helps in improving slew rate (I/C) with the same low current. In an embodiment, the interface can achieve high data throughput with current consumption less than 1 mA, which is significantly lower than the typical 3.5 mA used in conventional LVDS techniques. Other advantages include order of magnitude savings in power over voltage mode techniques, a high noise margin facilitating a robust design, and reduced EMI injection.

Figure 4:
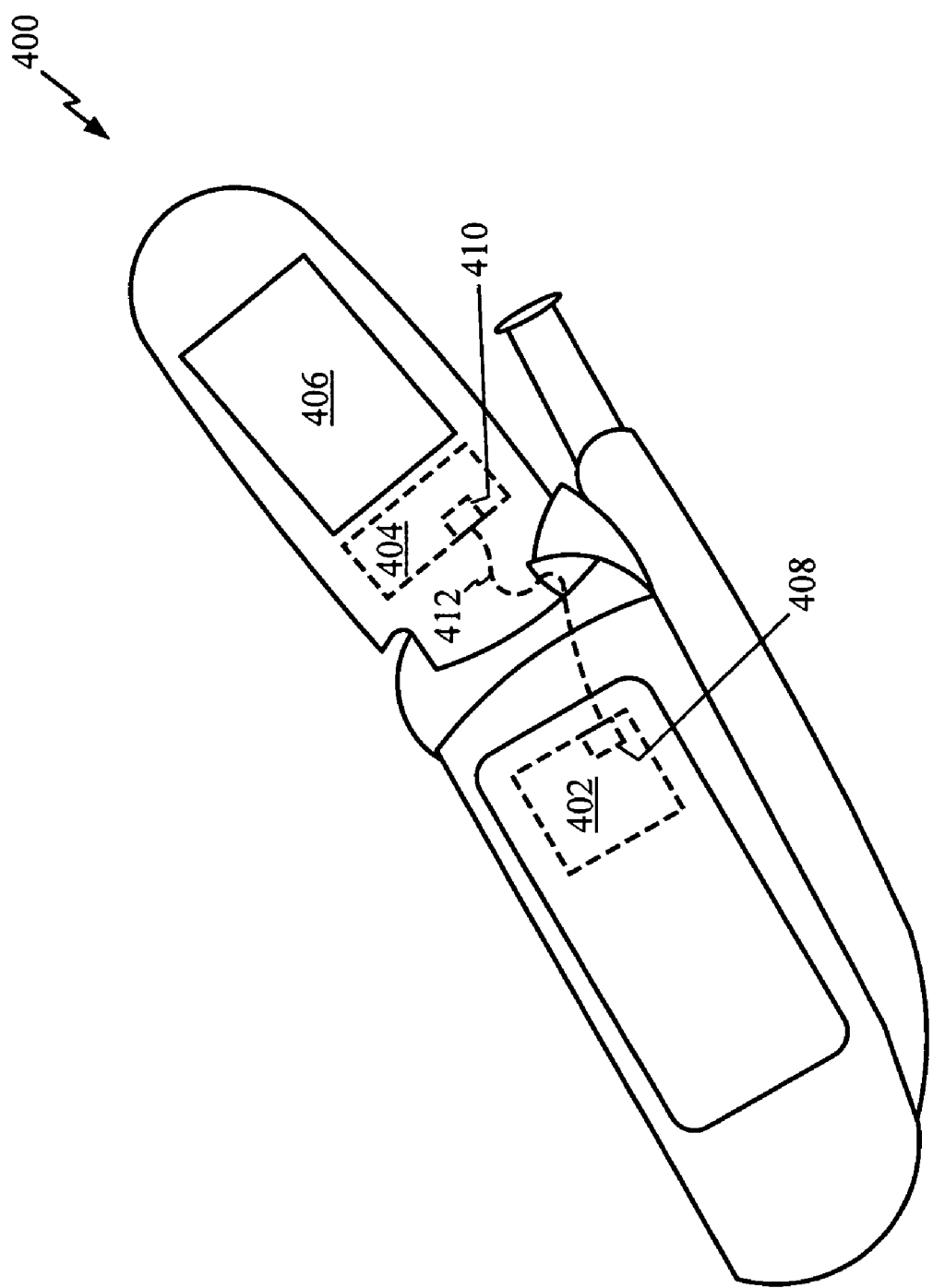
FIG. 4 shows a mobile phone including a current mode transceiver interface according to an embodiment.

The current mode interface transceiver may be used in a variety of applications. For example, FIG. 4 shows a mobile phone 400 including a current mode transceiver interface for communicating data between a processor 402 and a display controller 404 for a liquid crystal display (LCD) 406 (internal elements shown with dashed lines). A driver 408 on the processor 402 transmits data to a receive block 410 on the display controller 404 across transmit lines 412. As described above, each chip may include both a driver and a receiver block for bi-directional data transfer, and multiple interfaces may be used to transfer data in parallel between chips.

A number of embodiments have been described. Nevertheless, it will be understood that various modifications may be made without departing from the spirit and scope of the invention. Accordingly, other embodiments are within the scope of the following claims.

What is claimed is:

1. A circuit device comprising:
    a first input responsive to a first transmission line to receive a first signal;
    a second input responsive to a second transmission line to receive a second signal;
    a first current comparator coupled to the first input to compare the first signal to a first reference current and to produce a first differential voltage at a first output node;
    a second current comparator coupled to the second input to compare the second signal to a second reference current and to produce a second differential voltage at a second output node; and
    a voltage comparator including a first input coupled to the first output node and a second input coupled to the second output node, the voltage comparator to sense a differential voltage between the first output node and the second output node and to provide an output voltage related to the first signal and the second signal,
    wherein the first current comparator comprises:
    a first transistor comprising:
        a first terminal coupled to the first input;
        a first control terminal coupled to the first terminal:
        a second terminal coupled to an electrical ground; and
    a second transistor comprising:
        a third terminal coupled to receive the first reference current;
        a second control terminal coupled to the first terminal of the first transistor; and
        a fourth terminal coupled to the electrical ground;
    wherein the first output node is coupled to the third terminal.

2. The circuit device of claim 1, further comprising a reference current source adapted to produce the first reference current and the second reference current.

3. The circuit device of claim 2, wherein the first reference current and the second reference current comprise a common reference current, and wherein the first differential voltage and the second differential voltage have a differential voltage swing that can be controlled by changing a current level associated with the common reference current.

4. The circuit device of claim 1, wherein the second current comparator comprises:
    a third transistor comprising:
        a fifth terminal coupled to the second input;
        a third control terminal coupled to the fifth terminal;
        a sixth terminal coupled to the electrical ground; and
    a fourth transistor comprising:
        a seventh terminal coupled to receive the second reference current;
        a fourth control terminal coupled to the fifth terminal of the third transistor; and
        an eighth terminal coupled to the electrical ground;
    wherein the second output node is coupled to the seventh terminal.

5. The circuit device of claim 1, wherein the voltage comparator comprises a differential amplifier.

6. The circuit device of claim 1, further comprising a resistor coupled between the first input and the second input.

7. The circuit device of claim 1, wherein the first reference current and the second reference current comprise a common reference current, and wherein the first differential voltage and the second differential voltage have a differential voltage swing that can be controlled by changing a current level associated with the common reference current.

8. The circuit device of claim 7, wherein the differential voltage swing is less than approximately 20 millivolts.

9. The circuit device of claim 1, wherein the voltage comparator comprises a cascode operational amplifier.

10. The circuit device of claim 1, further comprising a driver circuit coupled to a first end of each of the first and second transmission lines, the driver circuit operative to inject a current signal onto at least one of the first and second transmission lines, wherein the current signal comprises the first signal and the second signal.

* * * * *